United States Patent [19]

Siebold et al.

[11] Patent Number: 5,200,701
[45] Date of Patent: Apr. 6, 1993

[54] MAGNETIC RESONANCE IMAGING APPARATUS WITH REGULATOR FOR REDUCING EDDY CURRENT EFFECTS

[75] Inventors: Horst Siebold, Erlangen; Ralph Oppelt, Weiher; Guenter Ries, Erlangen, all of Fed. Rep. of Germany

[73] Assignee: Siemens Aktiengesellschaft, Munich, Fed. Rep. of Germany

[21] Appl. No.: 761,650

[22] Filed: Sep. 18, 1991

[30] Foreign Application Priority Data

Sep. 20, 1990 [DE] Fed. Rep. of Germany ....... 4029816
Aug. 19, 1991 [EP] European Pat. Off. ......... 91113857.6

[51] Int. Cl.$^5$ .......................................... G01R 33/20
[52] U.S. Cl. ................................... 324/309; 324/322
[58] Field of Search ............... 324/300, 307, 309, 310, 324/311, 312, 313, 314, 318, 322; 128/653.2, 653.5

[56] References Cited

U.S. PATENT DOCUMENTS 4,585,995 4/1986 Flugan ............................... 324/322
4,703,275 10/1987 Holland ............................. 324/318

FOREIGN PATENT DOCUMENTS 0161782 11/1985 European Pat. Off. .
0291157 11/1988 European Pat. Off. .
0307516 3/1989 European Pat. Off. .
3737133 5/1989 Fed. Rep. of Germany .

OTHER PUBLICATIONS

"Grundschaltungen" Beuth et al. Electronik 3, pp. 335-354.

Primary Examiner—Michael J. Tokar
Attorney, Agent, or Firm—Hill, Steadman & Simpson

[57] ABSTRACT

A magnetic resonance imaging apparatus for producing tomograms has a C-magnet with substantially planar pole faces for generating a magnetic field in the direction of the z-axis of a Cartesian coordinate system, for examining a human body having a body axis extending in the direction x-axis, the region to be examined being disposed between the pole pieces, gradient coils substantially parallel to the pole pieces, and a regulator for controlling the gradient currents of the gradient coils using the magnetic flux associated with each gradient coil as the measure value effecting such control. The gradient currents are adjusted dependent on disturbances in the magnetic flux which are caused by eddy currents and saturation effects in the ferromagnetic material in the proximity of the pole faces. Such a regulator can also be used in combination with gradient coils for generating a gradient in the z-direction for compensating for transient inhomogeneities in the main magnetic field.

15 Claims, 9 Drawing Sheets

|        | 72 | 73 | 74 | 75 | 76 | 77 | 78 | 79 |
|--------|----|----|----|----|----|----|----|----|
| $G_x$  | −  | +  | +  | −  | +  | −  | −  | +  |
| $G_y$  | −  | −  | +  | +  | +  | +  | −  | −  |
| $G_z$  | −  | −  | −  | −  | −  | −  | −  | −  |
| $b_e(t)$ | − | − | − | − | + | + | + | + |

FIG 12

MAGNETIC RESONANCE IMAGING APPARATUS WITH REGULATOR FOR REDUCING EDDY CURRENT EFFECTS

BACKGROUND OF THE INVENTION

1. Field of the Invention

The present invention is directed to a magnetic resonance imaging (MRI, or nuclear magnetic resonance, NMR) apparatus for producing a tomogram of an examination subject, such as a human body.

2. Description of the Prior Art

Magnetic resonance imaging systems are known having a magnet which generates a main or static magnetic field in the direction of z-axis of a Cartesian coordinate system, for examining a human body having a body axis extending in the direction of the x-axis, with the body region to be examined being situated between substantially planar pole faces of the main field magnet. Gradient coils are also provided parallel to the pole faces of the main field magnet. The magnetic circuit generally contains ferromagnetic material, at least in the proximity of its pole faces.

For producing tomograms of a body, for conducting joint diagnostics, and for portraying blood vessels, a tomogram is produced by computational or mensurational analysis of integral proton resonance signals from the spatial spin density or relaxation time distribution of the examination subject. The examination subject, such as a human body, is introduced into the strong, uniform magnetic field, referred to as the static or main field, which aligns the nuclear spins in an imaging volume between the pole faces. Pulsed gradient coils are provided which generate gradient fields in three different dimensions in the imaging volume for topical resolution. A high-frequency antenna excites the nuclear spins, and acquires the signals emitted by the precessing nuclei to a receiver.

If a main magnetic field having a magnetic field strength greater than approximately 0.5 T is needed, the magnet used to generate such a field will generally be a superconducting magnet system in the form of a solenoid, which generates a static main magnetic field proceeding in the direction of the body axis of the patient. For generating lower fields, it is also known to use magnets having pole pieces connected by a yoke, which can be configured to form a C-magnet, an H-magnet, or a window-frame magnet. Such types of magnet systems are disclosed in the context of magnetic resonance imaging in, for example, European Application 0 161 782.

In magnetic resonance imaging systems using such a pole piece magnet to generate the main magnetic field, the body axis of the patient extends in the direction of the x-axis of a Cartesian (rectangular) coordinate system, and the imaging volume is situated between the pole pieces, with the main magnetic field proceeding in the direction of the z-axis. The pole pieces generally at least partially consist of ferromagnetic material. Such a magnet is disclosed in German OS 37 37 133.

The gradient coils for the magnetic resonance imaging apparatus are generally in the form of flat coils, and are arranged on the pole pieces. The poles pieces generally contain soft iron at least in the proximity of the pole faces, such soft iron being both magnetically permeable and electrically conductive. The presence of such material can cause image disturbances during operation of the apparatus, by virtue of eddy currents present in the iron, and by the non-linear behavior of the iron due to saturation effects when the magnetic flux of the gradient coils permeates the iron of the magnetic poles.

SUMMARY OF THE INVENTION

It is an object of the present invention to provide magnetic resonance imaging apparatus of the type having a magnet with ferromagnetic pole pieces wherein the frequency and amplitude response of the gradient fields is linearized and wherein image disturbances caused by eddy currents and saturation effects in the iron of the pole pieces are substantially eliminated.

The above object is achieved in accordance with the principles of the present invention in a magnetic resonance imaging apparatus wherein the gradient coils are connected in series with opposite current directions and are connected to a voltage-controlled power supply unit having an input voltage which is prescribed by a regulator. An adder is connected to the regulator and the respective gradient currents of the gradient coils are used as the adjustment variable for controlling the magnetic flux of the gradient coils, dependent on changes in magnetic flux caused by eddy currents and saturation effects in the ferromagnetic material in the proximity of the pole faces. A sensor coil is allocated to each gradient coil for measuring the magnetic flux, which is to be used as the regulating variable. A no-load voltage $U_L$ of the sensor coil is provided as an input signal for a low-pass filter which functions as an integrator above a lower limit frequency $f_u$, and whose output signal above the limit frequency $f_u$ is used as the measured value for the regulator, this output signal being proportional to the magnetic flux.

Under certain conditions, at least the gradient coils which generate the gradient in the z-direction ($G_z$) can be provided with an additional regulator which compensates for any transient changes in the main magnetic field which may arise due to the aforementioned eddy current and saturation effects.

DESCRIPTION OF THE DRAWINGS

FIGS. 9 through 12 explain electronic operational sign weighting for the individual sensor coils.

DESCRIPTION OF THE PREFERRED EMBODIMENTS

Figure 1:
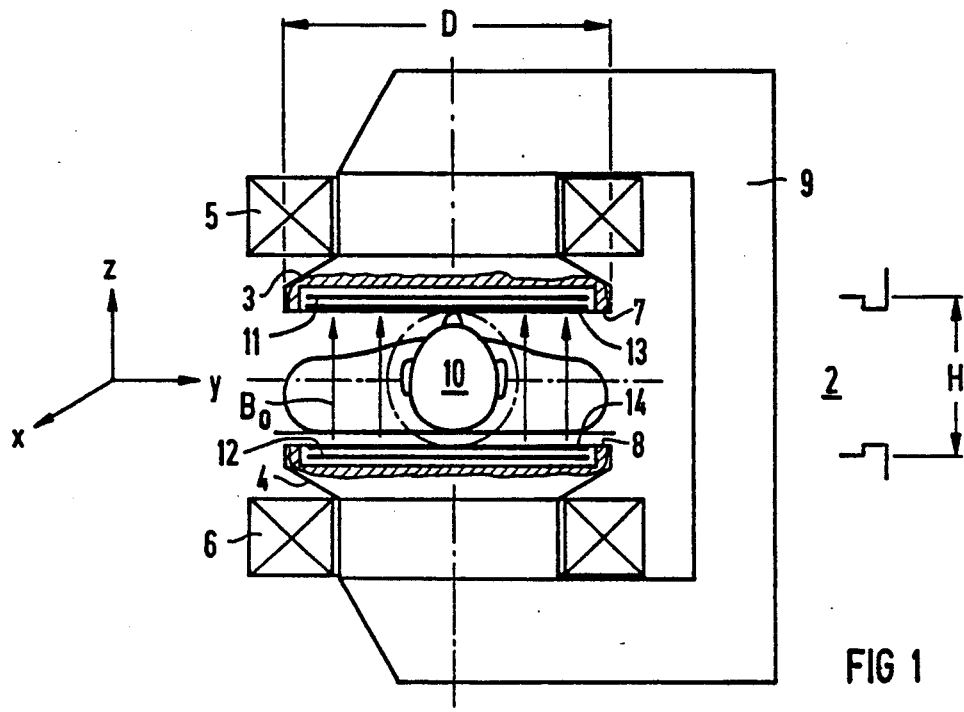
FIG. 1 is an end view of magnetic resonance imaging apparatus constructed in accordance with the principles of the present invention.

In the embodiment of a magnetic resonance imaging apparatus shown in FIG. 1, a magnet 2 for generating the static, main magnetic field is shown as a C-magnet. The main magnetic field proceeds parallel to the z-axis of a rectangular coordinate system, the axes of which are oriented as shown in FIG. 1.

The apparatus is provided for examining a subject such as a human body, having a body axis extending in the direction of the x-axis of the coordinate system, and having a body region to be examined which is situated between the pole pieces 3 and 4 of the magnet 2 in an approximately spherical imaging volume 10, indicated with dot-dashed lines. The imaging volume 10 has a diameter, for example, of approximately 40 cm. The poles of the main field magnet 2 have a diameter of, for example, d=100 cm and a spacing therebetween of, for example, H=45 cm. The poles respectively are provided with field coils 5 and 6, which generate the main magnetic field $B_o$, which proceeds in the direction of the z-axis in the coordinate system in the imaging volume 10. Instead of the use of field coils, permanent magnet discs can be used at the poles. The origin of the coordinates of the coordinate system (which is shown outside of the imaging volume 10 for clarity) should be disposed at the midpoint between the pole faces 7 and 8 of the main field magnet 2, so that the field axis coincides with the axis of rotation (not separately referenced in FIG. 1) of the pole pieces 3 and 4. The magnetic circuit for the main magnetic field $B_o$ is closed by a magnetic yoke 9.

In practice, at least the pole faces 7 and 8, and preferably the entire poles and the field coils 5 and 6, and possibly the magnetic yoke as well, will be provided with a shielding (not shown in the FIG. 1) for high-frequency fields, which consist of a coating of electrically conductive, non-magnetic metal, preferably copper.

A coil system containing gradient coils 11 and 12 for generating an x-gradient, a y-gradient and a z-gradient, is embedded in recesses in the pole faces 7 and 8. The gradient coils 11 and 12 are in the form of flat coils, and are schematically shown in the FIG. 1 for simplification. In accordance with the principles of the present invention, respective sensor coils 13 and 14, also in the form of flat coils, are allocated to the gradient coils 11 and 12. The sensor coils 13 and 14 are disposed parallel to the pole faces 7 and 8 and parallel to the gradient coils 11 and 12.

Figure 2:
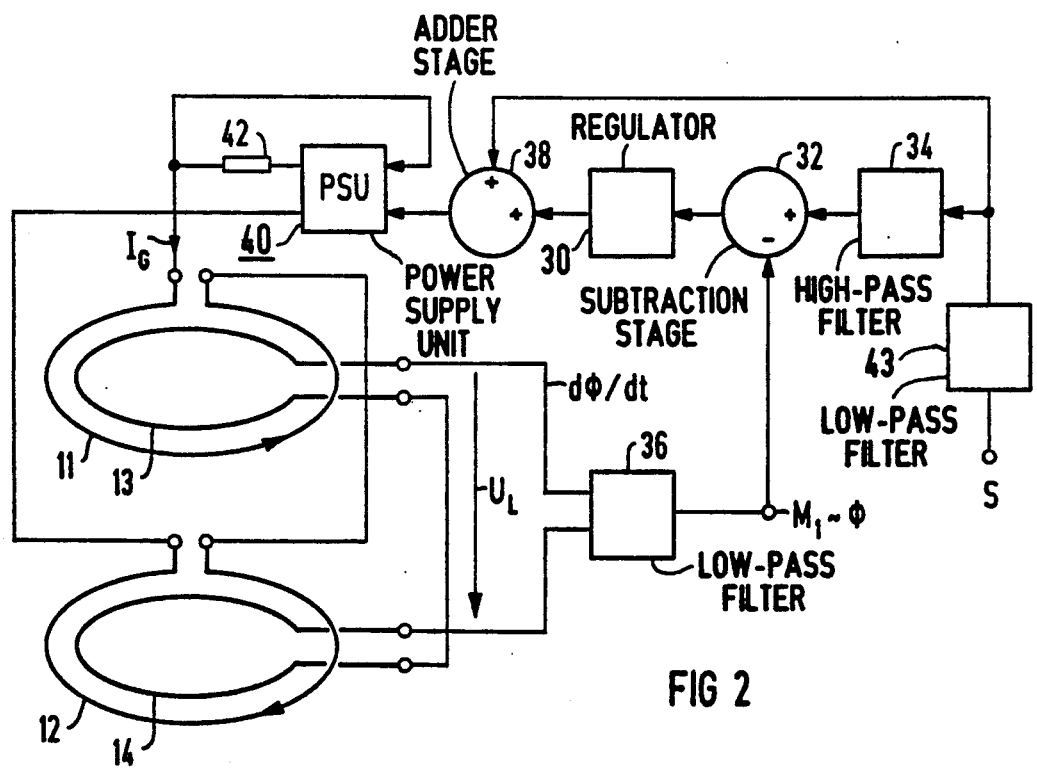
FIG. 2 is a schematic block diagram of a control circuit for either the $G_x$ or $G_y$ gradient in the apparatus of FIG. 1.

The gradient coils 11 and 12 are directly adjacent the ferromagnetic material of the pole pieces 3 and 4 without shielding therebetween, so that the gradient fields generated by these coils cause eddy currents in the pole pieces 3 and 4, as well as creating magnetic saturation effects, which in turn have a disturbing effect on fields generated by the coils 11 and 12. Accordingly, a regulation or control system for the magnetic flux of the gradient coils 11 and 12, dependent on the reactions of the gradient fields due to the eddy currents and magnetic saturation effects, is provided. In a practical embodiment, the gradient coils 11 and 12, for example, may each consist of two segments arranged mirror-symmetrically relative to each other, however, in FIG. 2 the coils 11 and 12 are each shown only as an individual turn for simplification. These gradient coils 11 and 12 are connected in series so as to have current flow in opposite directions. The allocation of the sensor coils 13 and 14 to the gradient coils 11 and 12 is shown in FIG. 2, the sensor coils 13 and 14 also being shown in FIG. 2 as a single turn for simplification. The sensor coils 13 and 14 are also connected in series so as to have opposite current flow directions.

A common control circuit, which includes a regulator 30, is connected to the gradient coils 11 and 12. The input to the regulator 30 is formed by a subtraction stage 32, having a negative input to which a measured value $M_1$ (formed as described in greater detail below) is supplied, and a positive input to which a reference variable S is supplied, via a high-pass filter 34. The reference variable input S may be a pulse sequence having approximately trapezoidal pulses, the amplitude of the pulses defining the desired or rated value of the control loop.

The subtraction stage 32 receives the measured value $M_1$ from a low-pass filter 36, which converts the flux change $d\phi/dt$, registered at the sensor coils 13 and 14 as an actual value, into the measured value $M_1$ which is proportional to the magnetic flux $\phi$ above a lower limit frequency $f_u$ of the low-pass filter 36.

The output of the regulator 30 is supplied to an adder stage 38, to which the reference variable input S is also directly supplied (i.e., is supplied unregulated). The output signal of the adder stage 38 is supplied to a voltage-controlled power supply unit PSU for the gradient current $I_G$ of the gradient coils 11 and 12. In FIG. 2, this power supply unit is referenced 40, and a resistor 42 is contained in the feedback branch of the power supply unit 40.

As also shown in FIG. 2, under some circumstances it may be expedient to supply the reference variable input S to the control circuit via a low-pass filter 43.

Figure 3:
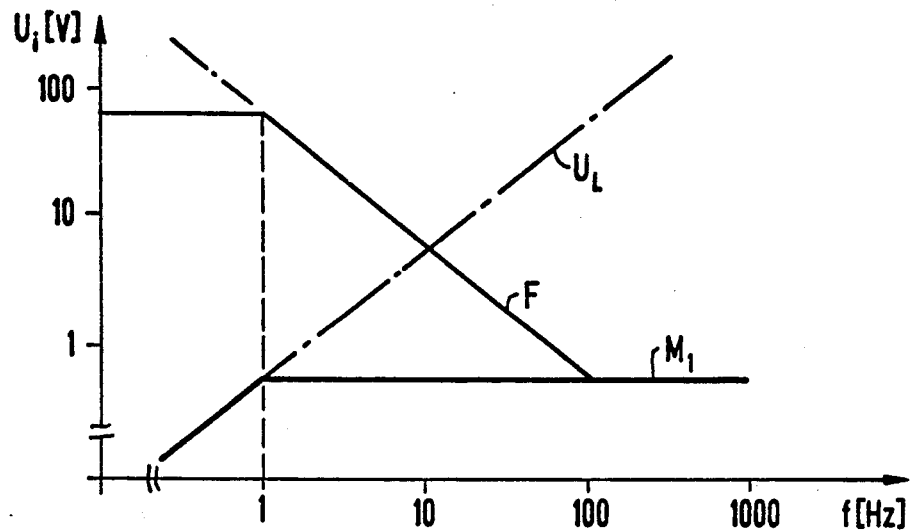
FIG. 3 is a graph for explaining the operation of the control circuit of FIG. 2.

A no-load voltage $U_L$ is measured at the sensor coils 13 and 14, as shown in the diagram of FIG. 3, wherein the voltage $U_i$ induced in the sensor coils 13 and 14 is entered in volts in a logarithmic scale with respect to the frequency f in Hz, which is also entered in a logarithmic scale. The no-load voltage $U_L$ is not proportional to the flux $\phi$ at the sensor coils 13 and 14, but is proportional to flux change $d\phi/dt$, so that the amplitude of the no-load voltage $U_L$ increases linearly with the frequency f. A measured value is required, however, which is proportional to the flux $\phi$ for the control circuit. Therefore, the low-pass filter 36, having a transfer function $F \sim 1/f$, above the lower limit frequency $f_u$ of, for example, 1 Hz, is provided. Above the limit frequency $f_u$, the low-pass filter 36 functions as an integrator, and supplies the measured signal $M_1$ (which is proportional to the flux $\phi$), which is forwarded to the subtraction stage 32 as shown in FIG. 2. Control is not necessary under the limit frequency $f_u$. The high-pass filter 34 is complementary to the low-pass filter 36, and therefore only a desired or rated value is prescribed which has the same type of high-pass frequency response as the measured signal $M_1$. As a result, a true integrator which, as is known, is unstable at the frequency f=0 Hz due to drift, need not be used for conversion of the flux change $d\phi/dt$ into the flux $\phi$. For limiting the maximum possible edge steepness, a low-pass filter 43 having an upper limit frequency of, for example, $f_o=5$ kHz, can be provided for the reference variable input S. The subtraction stage 32 supplies the regulator 30 with an input voltage which is proportional to the control deviation. For example, a proportional regulator or a proportional-differential regulator whose output signal is added to the rated value in the adder stage 38, can be provided as the regulator 30. The voltage-controlled power supply unit 40 converts its input voltage into a proportional gradient current $I_G$ which is supplied to the gradient coils 11 and 12.

Above the limit frequency $f_u$, the low-pass filter 36 functions as an integrator, and functions in a complementary manner with respect to the high-pass filter 34, which supplies the reference variable input S with the same frequency response as the measured signal.

Figure 4:
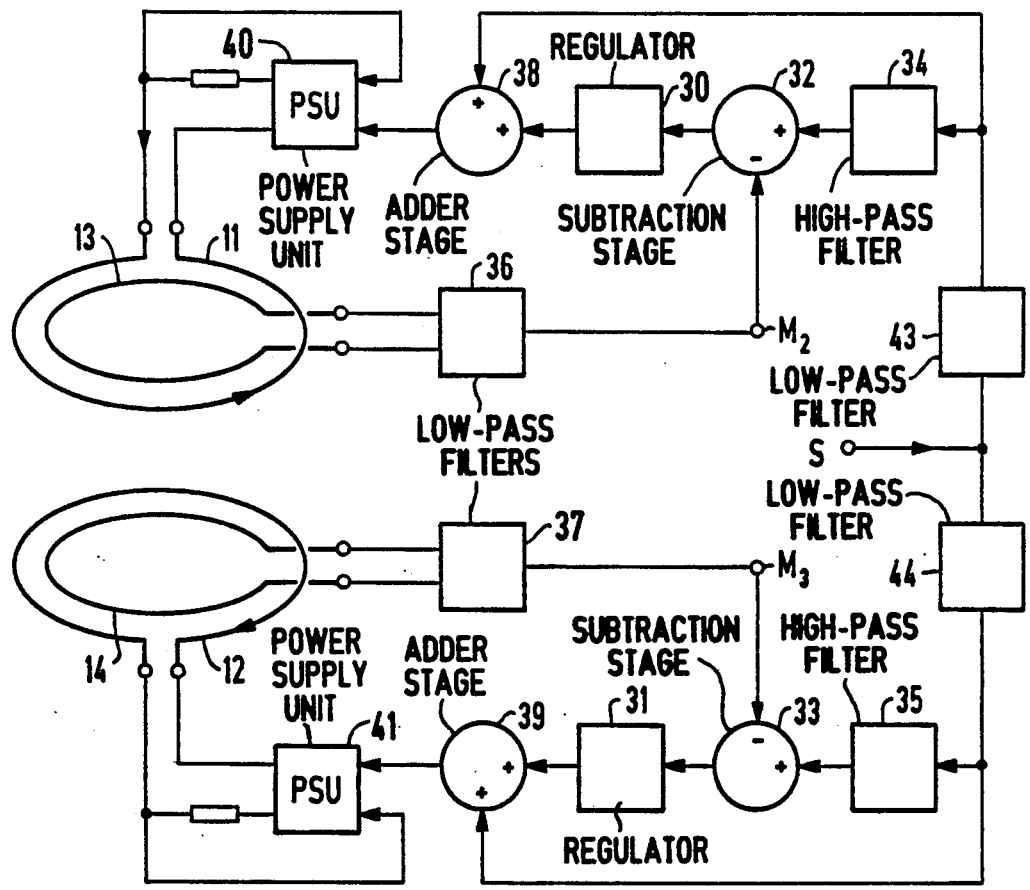
FIG. 4 is a schematic block diagram of a control circuit for the gradient coils for generating the $G_z$ gradient, with separate sub-circuits for respectively controlling two gradient coils.

The gradient $G_z$ is in the same direction as the main magnetic field $B_0$ at one of the pole plates, for example at the pole face 7 in the embodiment of FIG. 1, and is in a direction opposite to the direction of the main magnetic field $B_0$ at the other pole plate, for example at the pole face 8. For controlling this gradient $G_z$, circuitry is provided as shown in FIG. 4 which undertakes an acquisition of the magnetic flux $\phi$ and a control of the two gradient coils 11 and 12 separately from the aforementioned measurement and control. As shown in FIG. 4, the two gradient coils 11 and 12 are connected in series to as to have opposite current flow directions, and are connected to respective voltage-controlled power supply units 40 and 41. The input voltage to the power supply unit 40 is supplied by a control circuit which includes a regulator 30, and the input voltage for the power supply unit 41 is supplied by a control circuit which includes a regulator 31. The sensor coils 13 and 14 are respectively connected to low-pass filters 36 and 37, whose respective input signals are proportional to the magnetic flux change $d\phi/dt$, and whose respective output signals are proportional to the magnetic flux $\phi$ above the limit frequency $f_u$. The respective outputs of the low-pass filters 36 and 37 are supplied to the control circuit allocated thereto as measured values $M_2$ and $M_3$. These measured values $M_2$ and $M_3$ each serve as the actual value for the repetitive error in the respective control circuit. In the embodiment of FIG. 4, the control circuits are provided with a common reference variable input S, which again may be a pulse sequence as described above. The reference variable input S is supplied to the regulator 30 via a low-pass filter 43 and a high-pass filter 34, and is supplied to the regulator 31 via a low-pass filter 44 and a high-pass filter 35. The reference variable input S is directly supplied to the positive input of an adder stage 38, having another positive input to which the output of the regulator 30 is supplied. The reference variable S is also directly to the positive input of an adder stage 39, having another positive input to which the output of the regulator 31 is supplied. The outputs of the low-pass filters 36 and 37 (i.e., $M_2$ and $M_3$) are respectively supplied to the negative inputs of subtraction stages 32 and 33, having respective positive inputs to which the outputs of the high-pass filters 34 and 35 are supplied. The outputs of the subtraction stages 32 and 33 are respectively supplied to the inputs of the regulators 30 and 31. The two control circuit branches in the embodiment of FIG. 4 each operate individually in the manner described in connection with the control circuit of FIG. 2. In the embodiment of FIG. 4, however, image disturbances which are caused by eddy currents in the pole plates, as well as image disturbances caused by transient reactions $b_0(t)$ of the main magnetic field due to magnetic non-linearities, can be leveled (compensated).

Figure 5:
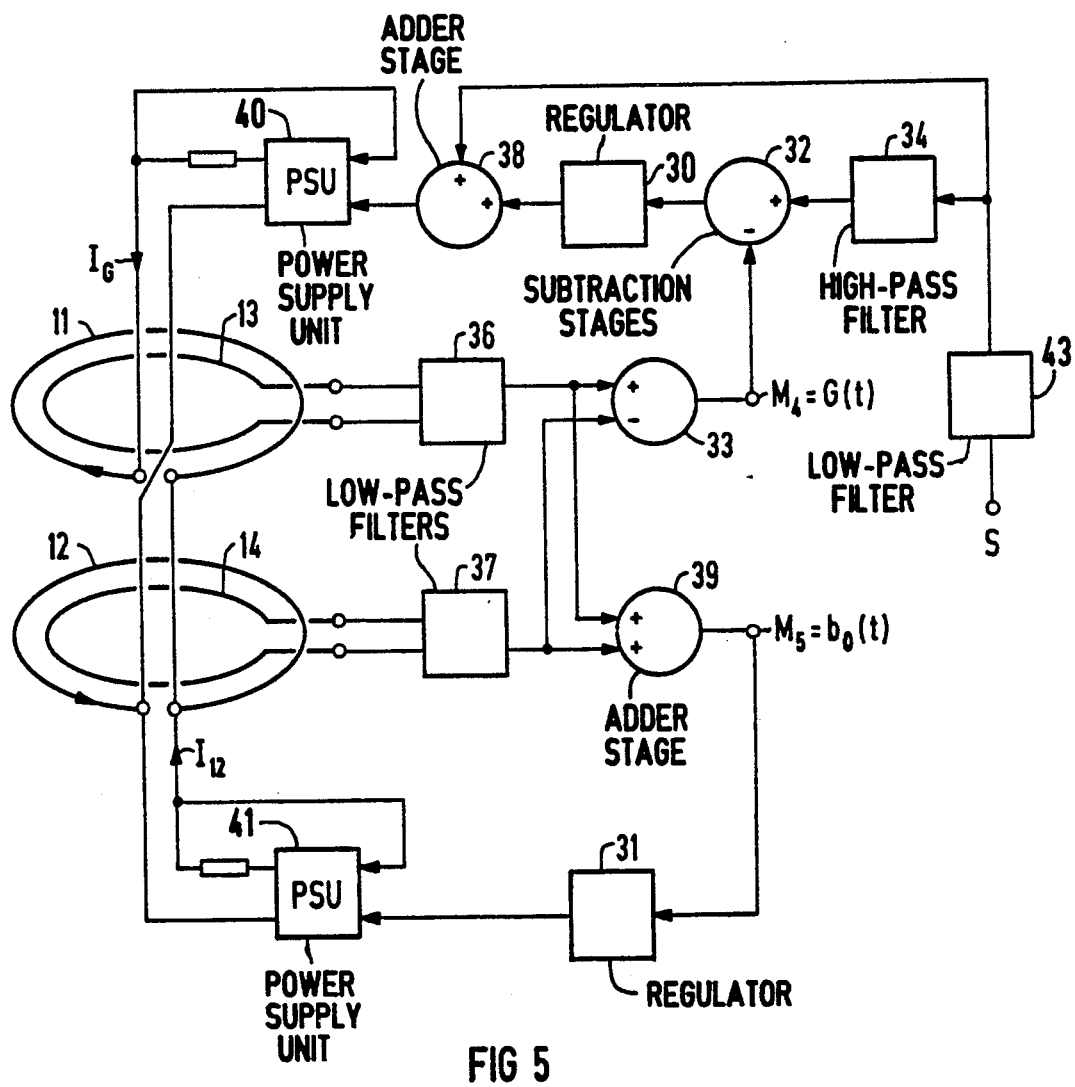
FIGS. 5 and 6 are schematic block diagrams respectively showing further embodiments of a control circuit for the coils generating $G_z$ gradient.

In a further embodiment of a flux control circuit shown in FIG. 5, having separate control circuits for the gradient $G_z$, the two gradient coils 11 and 12 are connected in series for opposite current flow, and are connected to a common voltage-controlled power supply unit 40. An additional voltage-controlled power supply unit 41, having an input voltage supplied by the additional regulator 31 is provided for the gradient coil 12. The sensor coil 13 has a control circuit allocated thereto which essentially corresponds to the embodiment of FIG. 2, however in the embodiment of FIG. 5 the low-pass filters 36 and 37 are respectively followed by a subtraction stage 33 and an adder stage 39, each receiving the outputs of both low-pass filters 36 and 37. In the embodiment of FIG. 5 for flux control, the sum of and the difference between the magnetic fluxes in each of the sub-systems are regulated. The power supply unit 40 is of the standard performance category, and supplies the gradient current $I_G$ for both gradient coils 11 and 12. The further power supply unit 41, having significantly lower power output, is connected in parallel, and supplies a current $I_{12}$ which flows only through the gradient coil 12, because the controlled power supply unit 40 theoretically has an infinitely high internal resistance.

The no-load voltages $U_L$ measured by the sensor coils 13 and 14 are first "integrated" in the manner described above in connection with FIG. 2, so that they represent the magnetic sub-fluxes in the sensor coils 13 and 14. These sub-fluxes are then added and subtracted in the respective adder stage 39 and the subtraction stage 33. A change G(t) in the gradient is thus obtained at the output of the subtraction stage 33 as a measured signal $M_4$, which is proportional to the difference between the magnetic fluxes $\phi_{13} - \phi_{14}$, and which is supplied to the regulator 30 as the actual value. The power supply unit 40 then delivers the regulated gradient current $I_G$ for the useful gradient with the standard magnitude. The sum of the magnetic fluxes $\phi_{13} + \phi_{14}$ at the output of the adder stage 39 forms a measure for image disturbances which are caused by a transient decrease $b_0(t)$ in the main magnetic field. It is only this disturbing effect which is supplied by the adder stage 39 as a measured value $M_5$, which is proportional to the sum of the magnetic fluxes $\phi_{13} + \phi_{14}$, and which is forwarded to the power supply unit 41 as an input voltage via the regulator 31. The demands on the modulatability of the power supply unit 41 are thus generally significantly lower than the demands on the modulatability of the power supply unit 40.

Figure 6:
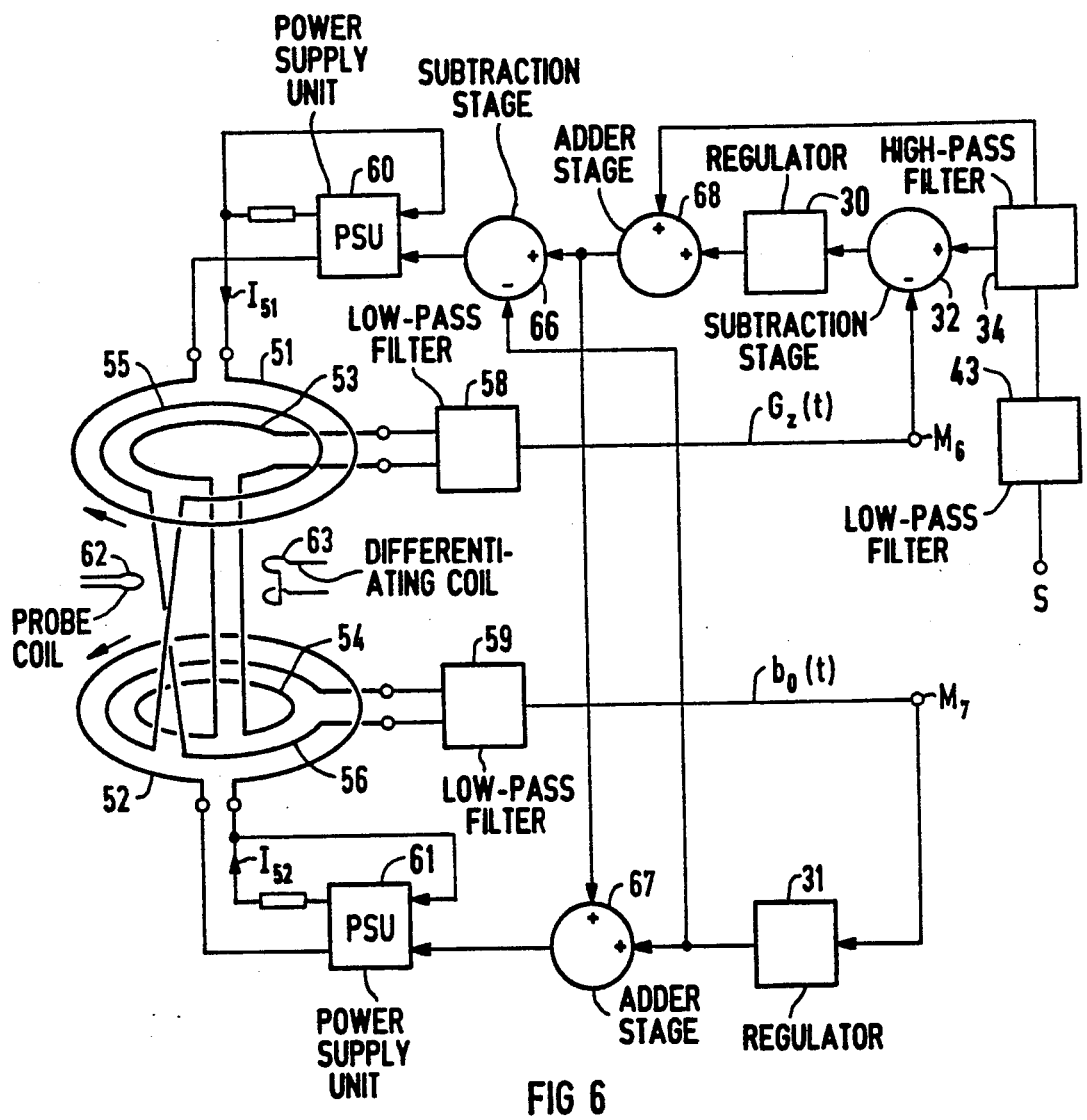

In a further embodiment for a control circuit shown in FIG. 6, a separate sensor coil system is provided for the gradient $G_z(t)$ and for a dynamic (time-varying) boost $b_0(t)$ for the main magnetic field. Two gradient coils 51 and 52 which generate the gradient $G_z$ have current flow in opposite directions, and are respectively connected to voltage-controlled power supply units 60 and 61. The input voltages of the power supply units 60 and 61 are respectively supplied by closed loop control circuits respectively having regulators 30 and 31. A sensor coil 53 is allocated to the gradient coil 51, and a sensor coil 54 is allocated to the gradient coil 52. The sensor coils 53 and 54 are connected in series for opposite current flow, and are connected to a common low-pass filter 58 which functions as an integrator above a lower limit frequency $f_u$. The output signal of the low-pass filter 58 is proportional to the gradient $G_z(t)$, and is forwarded to the two power supply units 60 and 61 with the same operational sign, as a measured signal $M_6$, via the control circuit having the regulator 30.

The gradient coils 51 and 52 respectively have additional sensor coils 55 and 56 allocated thereto, which are also connected in series for unidirectional current flow, and are also connected to a common low-pass filter 59 which functions as an integrator above a lower limit frequency $f_u$. The output signal of the low-pass filter 59 is proportional to the main magnetic field boost $b_0(t)$ and, with a positive operational sign, is supplied to the power supply unit 61 for the gradient current $I_{52}$ of the gradient coil 52 as a measured signal $M_7$ via the second control circuit having the regulator 31. The output signal of the low-pass filter 59 is also supplied with a negative operational sign to the power supply unit 60 for the gradient current $I_{51}$ of the first gradient coil 51. The sensor coils 53 and 54, as well as the sensor coils 55 and 56, can be dimensioned independently of each other, in terms of their diameter, distribution and number of turns, so that they supply signals proportional to the respective field flux as purely and accurately as possible.

Using an additional magnetic field probe 62, having a comparatively small diameter, which locally measures the flux density, the topical zero-axis crossing of the gradient field can be identified at low frequency of the gradient field for the gradient $G_z$ in the magnetic center, and can be defined as the zero point of the z-coordinate of the rectangular coordinate system. In this position, the magnetic field probe 62, after chronological integration, supplies only the main magnetic field boost $b_0(t)$ for monitoring purposes.

The zero-axis crossing of the gradient field could alternatively be calculated using some other magnetic field probe, for example a Hall probe, if the gradient field $G_z$ is stationarily activated.

For optimum detection of the dynamic main magnetic field boost $b_0(t)$, a larger number of sensor coils 55 and 56 may be provided which are axially symmetrically disposed on each of the poles faces 7 and 8 with respectively different radii $R_k$, for example five such sensor coils can be disposed at each pole face, in which case $k = 1, 2, 3, 4, 5$. Those sensor coils having the same radius $R_k$ respectively disposed at the upper pole face 7 and at the lower pole face 8, are isodirectionally connected to other so that they detect the main magnetic field $B_0$. The gradient currents $I_{51}$ and $I_{52}$ in the z-gradient coils will then be a unit step function $\delta_{-1}(t)$. The step response $^zb_{0,k}(t)$ of the various sensor coils having the respective radii $R_k$. The upper left index z indicates the gradient system which is being supplied by the step function current. Those sensor coils having a step response $^zb_{0,k}(t)$ which coincides best with the main magnetic field boost $^zb_0(t)$ centrally measured by the probe coil 62 can then be selected from the plurality of these coils for the $b_0(t)$ branch of the control circuit.

Alternatively, each of the sensor coils can be assigned a weighting factor, and a weighted sum of the responses $^zb_{0,k}(t)$ can be selected so that the sum substantially coincides with the centrally measured, dynamic main magnetic field boost $^zb_0(t)$. The weighting factors can be approximated by an appropriate selection of the number of turns $N_k$ for each coil having a radius $R_k$.

The sensor coils 53 and 54 for the gradient $G_z$ are oppositely connected to each other on the respective pole faces 7 and 8 so that they detect a gradient field $G_{z,k}(t)$. To that end, a locally measuring, oppositely polarized differentiating coil 63 can be provided as a probe for detecting the gradient field $G_z(t)$ in the center of the gradient field. The coil 63 simultaneously suppresses any field contributions of the main magnetic field boost which may arise. The response $G_z(t)$ of the central differentiating coil 63 is compared to the various step responses $G_{z,k}(t)$ of the sensor coils 53 and 54 to the unit step function $\delta_{-1}(t)$ of the gradient currents $I_{51}$ and $I_{52}$. A pair of the sub-coils among the sensor coils 53 and 54, or a combination of sub-coils, whose step response best coincides with the centrally measured value is then selected.

Figure 7:
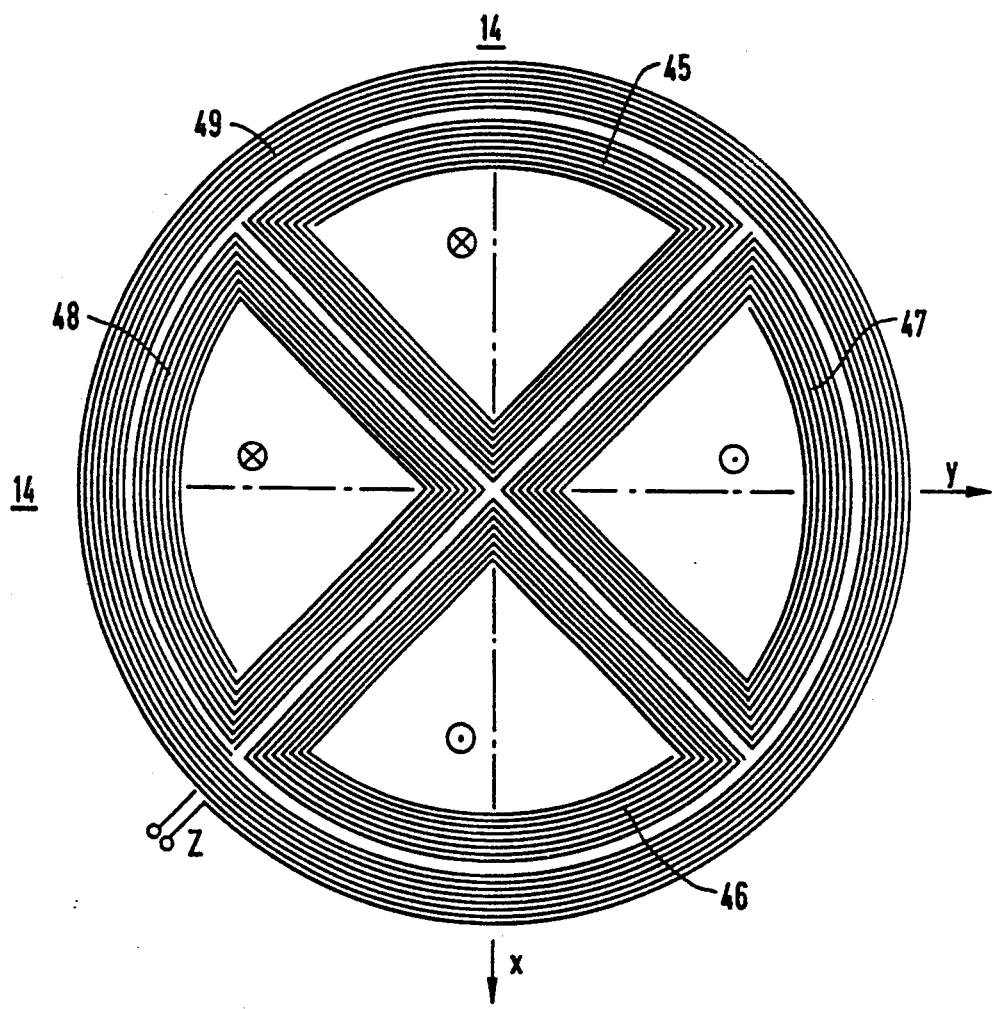
FIG. 7 is a plan view of a sensor coil for use in controlling the generation of the gradients in the above circuits.

In a preferred embodiment, the pole pieces 3 and 4 are respectively provided with a combination of sensor coils 13 and 14, which form the coil system as a common flat coil arranged parallel to the respective pole faces 7 and 8. As shown in FIG. 7 using the sensor coil 14 as an example, two sub-coils 45 and 46 for the gradient $G_x$ are formed as respective sectors of a circle, and are arranged so that their tips are directed toward each other. The direction of the gradient field in the FIG. 7 is indicated by the symbols for a vector head and a vector tail. In the same manner, two further sub-coils 47 and 48 for the gradient $G_y$ are arranged as sectors of a circle, rotated by 90° relative to the sub-coils 45 and 46, and disposed in the same plane so that, in combination, the sub-coils 45, 46, 47, and 48 approximately form a circular area. The sub-coils 45 through 48 are surrounded by a coil 49 having turns forming an annular area, and serving as a sensor coil for the gradient $G_z$. The electrical terminals for the sensor coil 49 are referenced Z in FIG. 7. The sub-coils 45 through 48 are connected externally, and are connected to each other for acquiring the gradient fluxes having the indicated directions. Such connecting conductors are not shown in FIG. 7, however, for simplification.

Figure 8:
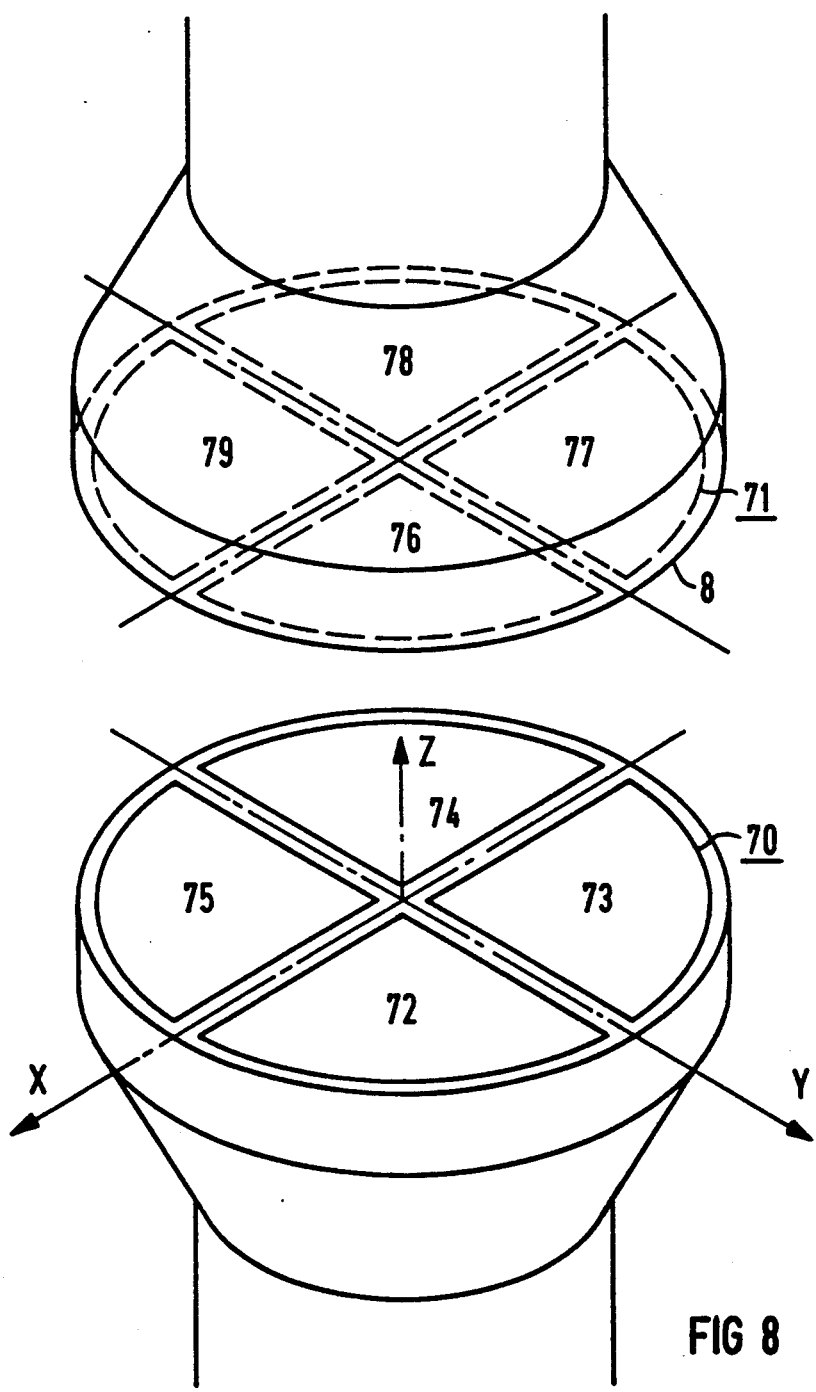
FIG. 8 is a perspective view of an arrangement of the sensor coils on the two pole faces in the apparatus shown in FIG. 1.

In the embodiment shown in FIG. 8, a common sensor coil system is provided for the gradients $G_x$, $G_y$ and $G_z$ and for the dynamic main magnetic field boost $b_0(t)$. The coil system of FIG. 8 contains two flat coils 70 and 71 respectively disposed on the pole faces 7 and 8. The flat coil 70 consists of four sub-coils 72 through 75, and the flat coil 71 consists of four sub-coils 76 through 79. These two combinations of sub-coils respectively form approximately circular areas on the pole faces 7 and 8 having an aperture angle of 90°. Two of these sub-coils, for example sub-coils 72 and 76, which are arranged in registry on the pole faces 7 and 8 in the direction of the main magnetic field $B_0$, i.e., in the z-direction, are connected in series for unidirectional current flow, and are connected to ground at the junction between the sub-coils, and are provided with an electronic operational sign weighting. The measured values $M_x$, $M_y$ and $M_z$ for the corresponding gradient fields, and preferably a measured value $M_{b0}$ as well for leveling the dynamic main magnetic field disturbances, are therefore present at the respective outputs of the associated electronics. As a result of this electronic operational sign weighting, the respective magnetic flux of each pole face is at least approximately acquired by the use of a single-layer sensor coil arrangement having the two flat coils 70 and 71. Compared to the embodiment of FIG. 7, there is no need in the embodiment of FIG. 8 for the outer sensor coil 49 for the gradient $G_z$. Therefore, the four sub-coils 72 through 75 and 76 through 79 can contain a correspondingly larger number of turns while retaining the same outside diameter, resulting in a further voltage gain.

Figure 9:
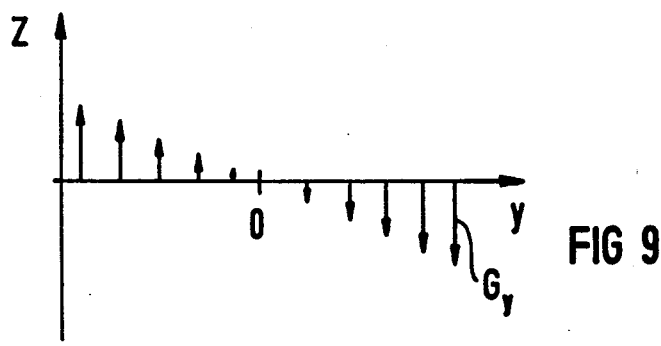
Figure 10:
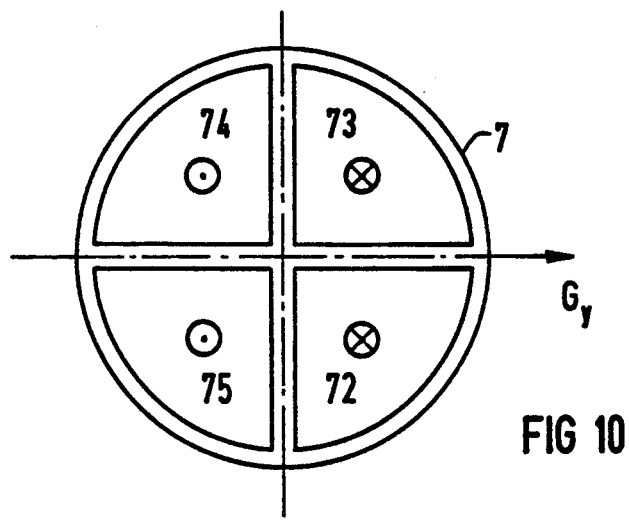

If such electronic operation sign weighting is undertaken using the coil arrangement shown in FIG. 8, the sub-coils will be weighted in pairs, with each two sub-coils (comprising a pair) disposed mirror-symmetrically relative to the gradient direction being weighted with the same operational sign. This is schematically indicated in FIG. 9, wherein the field vectors of the gradient field $G_y$ in the direction of the main magnetic field $B_z$ are entered on the horizontal axis, which represents the y-direction. These vectors have a negative direction on one-half of the pole face 7 and have a positive direction on the other half. Accordingly, as shown in FIG. 10, the two sub-coils 72 and 73, or the two sub-coils 76 and 77, which are mirror-symmetrically arranged relative to the direction of the gradient $G_y$, are weighted with a negative operational sign, and the two sub-coils 74 and 75, or the sub-coils 78 and 79, are weighted with a positive operational sign.

Figure 11:
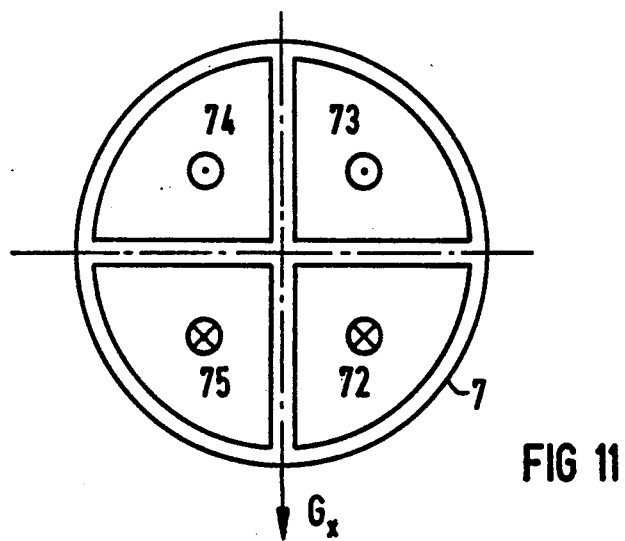

FIG. 11 also shows the arrangement of the sub-coils 72 through 75 on the pole plates 7, thus the sub-coils 72 and 75 which are mirror-symmetrically arranged relative to the direction of the gradient $G_x$ are weighted with a negative operational sign, and the sub-coils 73 and 74 are weighted with a positive operational sign. In an analogous manner, the sub-coils 76 and 79 are weighted with a negative operational sign, and the sub-coils 77 and 78 are weighted with a positive operational sign.

For the gradient $G_z$, all sub-coils 72 through 79 of the flat coil 70 are weighted with the same operational sign.

Figure 12:
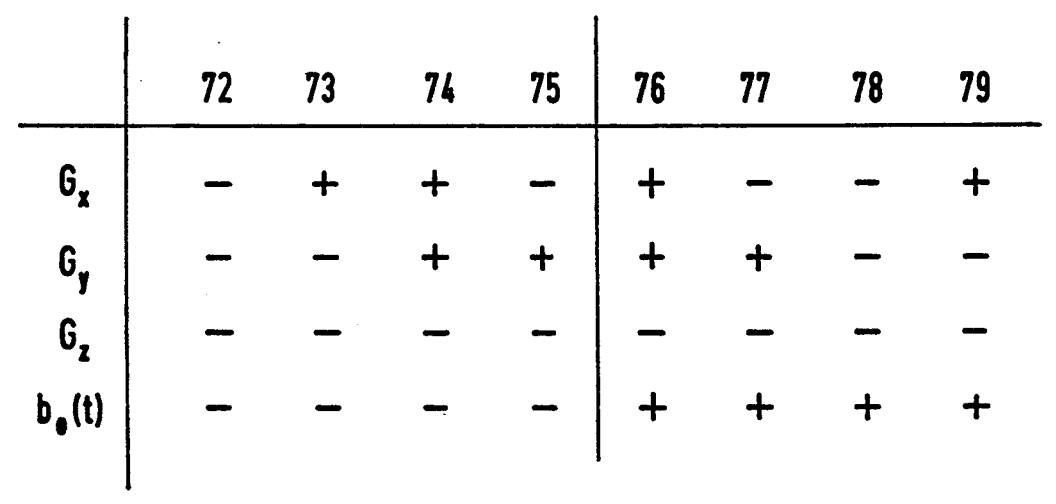

In a further preferred embodiment of the apparatus, the sub-coils of the two flat coils 70 and 71 also supply a contribution for the measured value $M_{bo}$ for correction of dynamic disturbances in the main magnetic field $B_0$. This is shown in FIG. 12, wherein the sub-coils 72 through 75 are shown weighted with the operational sign opposite that of the sub-coils 76 through 79.

Figure 13:
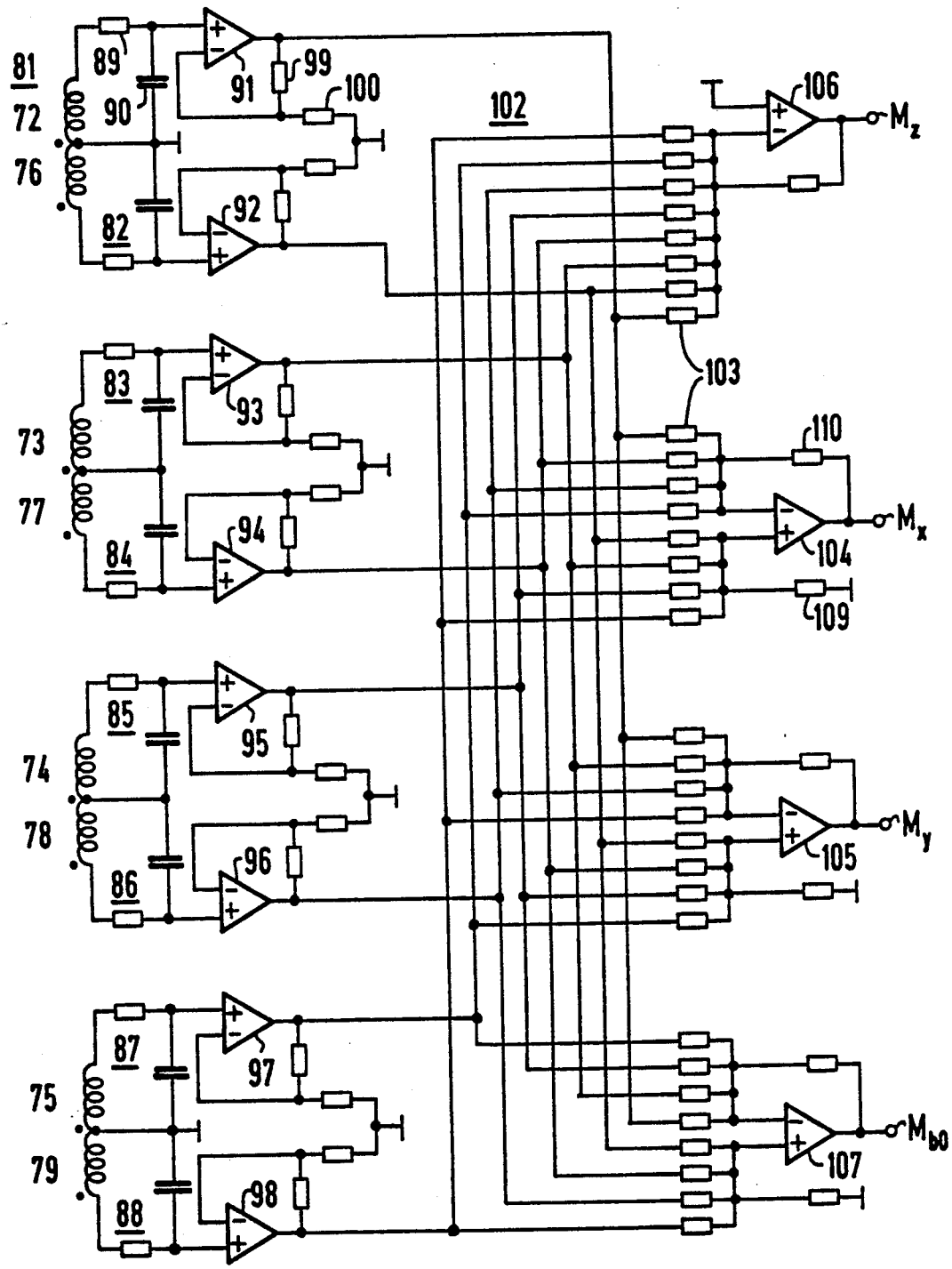
FIG. 13 is a circuit for undertaking the electronic operational sign weighting explained in FIGS. 9 through 12.

An embodiment for a circuit for accomplishing the above-described electronic weighting of the individual sub-coils 72 through 79, as well as for the separate acquisition of the measured values $M_x$, $M_y$ and $M_z$, and preferably also the separate acquisition of the measured value $M_{bo}$, plus actual values for the above-described control, is shown in FIG. 13. The sub-coils 72 and 76 are connected in series, with the winding start for each sub-coil being indicated by a dot. Similar arrangements are shown for the other pairs of sub-coils. The output signals of respective coils are supplied to processing circuitry associated with each coil, the components of the processing circuitry being individually numbered only for the coil 72, and all other circuits being identical thereto. For example, the output of the coil 72 is supplied to a pre-amplifier 91 via a low-pass filter 81, formed by a resistor 89 and a capacitor 90. The pre-amplifier 91 has a negative feedback network formed by resistors 99 and 100. The respective low-pass filters for the other coils are referenced 82, 83, 84, 85, 86, 87 and 88. The respective pre-amplifiers for the other coils are referenced 92, 93, 94, 95, 96, 97 and 98.

The output signals of all of the pre-amplifiers are supplied to operational amplifiers 104, 105, 106 and 107 via a bus 102 and summing resistors 103. The operational amplifiers 104, 105 and 106 respectively supply the measured values $M_x$, $M_y$ and $M_z$, and the operational amplifier 107 supplies the measured value $M_{bo}$ for control of the dynamic main magnetic field boost $b_0(t)$. The inputs to the operation amplifier are connected according to the table as shown in FIG. 12.

For example, the measured value of the sub-coil 72 is supplied via the low-pass filter 81 and the pre-amplifier 91 and the summing amplifier 103 to the negative input of the operational amplifier 104 which delivers the measured value $M_x$ for the gradient $G_x$ at its output. A negative feedback resistor for the operational amplifier 104 is referenced 110, and an input resistor is referenced 109. The measured values of the sub-coils 75, 77 and 78 are supplied to the negative input of the operational amplifier 104 according to the table in FIG. 12. The positive input of the operational amplifier 104 receives the signals of the sub-coils 73, 74, 76 and 79 according to the table in FIG. 12. In the same manner, the operational amplifier 105 forms the measured value $M_y$ at its output as the actual value for control of the gradient $G_y$ from the signals of the sub-coils 72, 73 78 and 79 with negative weighting, and from the signals of the sub-coils 74, 75, 76 and 77 with positive weighting. The operational amplifier 106 receives the signals from all eight sub-coils 72 through 79 at its negative input and supplies the measured value $M_z$ for the gradient $G_z$ at its output. The operational amplifier 107 for the measured value $M_{bo}$ for controlling the dynamic disturbances in the main magnetic field $B_0$ receives the signals of the sub-coils 72 through 75 at its negative input and receives the signals of the sub-coils 76 through 79 at its positive input.

The control of the gradient fields by means of the coils 72 through 79 ensues only above the limit frequency of the low-pass filters 81 through 88, i.e. only above approximately 1 Hz, because control is neither required nor meaningful below this limit frequency. Each sub-coil and its associated low-pass filter have opposite frequency responses above the low-pass limit frequency, so that an output signal is obtained which is independent of the frequency. In this embodiment of the nuclear magnetic resonance imaging apparatus, all eight sub-coils participate in the acquisition of the measured value for each of the gradients $M_x$, $M_y$ and $M_z$ as well as for the dynamic main magnetic field boost $b_0(t)$. Substantially the entire pole face is thus exploited for the acquisition of the measured value.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance imaging apparatus comprising:
   a main field magnet which generates a main magnetic field in the direction of the z-axis of a rectangular coordinate system, said magnet having planar pole pieces containing ferromagnetic material and having a gap between said pole pieces of a size for accommodating a body region to be examined of a human body having a body axis extending in the direction of the x-axis of said coordinate system;
   two gradient coils having respective oppositely flowing gradient currents, said gradient coils each generating a gradient field with magnetic flux associated therewith, said magnetic flux being subject to changes due to the presence of said ferromagnetic material;
   voltage-controlled power supply means connected to said gradient coils for supplying said gradient coils with said gradient currents;
   two sensor coils respectively associated with said gradient coils for measuring said changes in the magnetic flux of each gradient coil, and each sensor coil generating a no-load voltage corresponding to said changes;

low-pass filter means, functioning as an integrator above a lower limit frequency, for generating a measured value signal from said no-load voltage, said measured value signal being proportional to said magnetic flux; and regulator means, to which said measured value signal is supplied, connected to said voltage-controlled power supply means for controlling said power supply means for altering said gradient currents dependent on said magnetic flux.

2. A magnetic resonance imaging apparatus as claimed in claim 1 wherein said voltage-controlled power supply means consists of a single voltage-controlled power supply unit to which said two gradient coils are connected, wherein said low-pass filter means consists of a single low-pass filter to which said two sensor coils are connected, and wherein said regulator means is disposed in a single control circuit for altering said gradient currents of both of said gradient coils.

3. A magnetic resonance imaging apparatus as claimed in claim 1 further comprising:

an input for a reference variable signal;

high-pass filter means connected to said input for high-pass filtering said reference variable signal complementary to filter of said no-load voltage by said low-pass filter means;

said regulator means including a subtraction stage in which said measured value signal is subtracted from the output of said high-pass filter to form a difference signal which is used for altering said gradient currents.

4. A magnetic resonance imaging apparatus as claimed in claim 3 wherein said regulator means includes an adder in which said reference variable signal is added to a signal formed from said difference signal to obtain a sum, said sum being used for altering said gradient currents.

5. A magnetic resonance imaging apparatus as claimed in claim 1 further comprising:

means for generating dynamic boost in said main magnetic field through said two gradient coils.

6. magnetic resonance imaging apparatus as claimed in claim 1, wherein said gradient coils are connected in series;

said voltage-controlled power supply means includes first and second power supply units respectively connected to said gradient coils for supplying a gradient current only to the gradient coil connected thereto;

said low-pass filter means includes first and second low-pass filters respectively connected to said sensor coils; and said regulator means includes first and second regulators, said first regulator being connected between said first low-pass filter and said first power supply unit and forming in combination therewith a first control circuit exclusively for the gradient coil connected to said first power supply unit, and said second regulator being connected between said second low-pass filter and said second power supply unit forming in combination therewith a second control circuit exclusively for the gradient coil connected to said second power supply unit.

7. A magnetic resonance imaging apparatus as claimed in claim 1 wherein said gradient coils are connected in series;

said voltage-controlled power supply means includes a first power supply which supplies respective gradient currents to both gradient coils, and a second power supply unit which supplies a gradient current to only one of said gradient coils;

said low-pass filter means includes first and second low-pass filters respectively connected to said sensor coils;

wherein said regulator means includes a first regulator for controlling said first power supply unit and a second regulator for controlling said second power supply unit; and wherein said magnetic resonance imaging apparatus further comprises:

subtraction means for subtracting the outputs of said first and second low-pass filters to form a difference signal as a first measured value, said first measured value being used by said first regulator for controlling said first power supply unit; and adder means for adding the outputs of said first and second low-pass filters to generate a sum signal as a second measured value, said second measured value being supplied to said second regulator for controlling said second power supply unit.

8. A magnetic resonance imaging apparatus as claimed in claim 1 wherein said two sensor coils are connected in series for opposite current flow in said sensor coils;

said low-pass filter means includes first and second low-pass filters, said first low-pass filter being connected to said sensor coils;

said voltage-controlled power supply means includes a first power supply unit connected to one of said gradient coils for exclusively controlling the gradient current therein and a second power supply unit connected to the other of said gradient coils for exclusively controlling the gradient current therein;

said regulator means includes a first regulator having an input which receives a first measured value from the output of said first low-pass filter, said first regulator controlling said first power supply unit, and a second regulator controlling said second power supply unit; and said magnetic resonance imaging apparatus further comprising:

two further sensor coils connected in series for respective current flow in said further sensor coils in the same direction, said further sensor coils being connected to said second low-pass filter and said second low-pass filter forming a second measured value signal which is supplied to said second regulator;

subtraction means connected between said first regulator and said first power supply unit for forming a difference signal from the respective outputs of said first and second regulators, said difference signal being supplied to said first power supply unit for control thereof; and adder means connected between said second regulator and said second power supply unit for forming a sum signal from the respective outputs of said first and second regulators, said sum signal being supplied to said second power supply unit for control thereof.

9. A magnetic resonance imaging apparatus as claimed in claim 8 wherein each of said further sensor coils consists of a plurality of sub-coils, the respective pluralities of sub-coils being disposed axially symmetrically on said planar pole pieces, the sub-coils in each plurality having respectively different radii and respective sub-coils having the same radius being connected to each other for unidirectional current flow in said respective sub-coils, the connected sub-coils forming a plurality of sub-coil pairs, and said magnetic resonance imaging apparatus further comprising probe coil means for measuring said main magnetic field boost in a center of said main magnetic field, and means for selecting a pair of sub-coils for connection to said second low-pass filter having an output signal most closely coinciding with the main magnetic field boost measured by said probe coil means.

10. A magnetic resonance imaging apparatus as claimed in claim 8 wherein each of said sensor coils consists of a plurality of sub-coils, the respective pluralities of sub-coils being disposed axially symmetrically on said planar pole pieces, the sub-coils in each plurality having respectively different radii and respective sub-coils having the same radius being connected to each other for opposite current flow in said respective sub-coils, the connected sub-coils forming a plurality of sub-coil pairs, and said magnetic resonance imaging apparatus further comprising differentiating coil means for measuring said magnetic flux in a center of said main magnetic field, and means for selecting a pair of sub-coils for connection to said first low-pass filter having an output signal most closely coinciding with the magnetic flux measured by said differentiating coil means.

11. A magnetic resonance imaging apparatus as claimed in claim 1 wherein said two sensor coils are flat coils respectively disposed on said planar pole pieces.

12. A magnetic resonance imaging apparatus as claimed in claim 11, wherein each of said sensor coils consists of two sub-coils, each sub-coil forming a sector of a circle having respective tips pointing toward a center of said circle, said sub-coils being disposed on said planar pole pieces with the sub-coils forming one of said sensor coils being disposed at an angle of 90° relative to the sub-coils of the other sensor coil, and said sub-coils being surrounded by an annular coil forming one of said sensor coils.

13. A magnetic resonance imaging apparatus as claimed in claim 11 wherein each of said sensor coils comprises four sub-coils, each sub-coil forming a sector of a circle and the sub-coils of said sensor coils being respectively disposed on said planar pole pieces with the sub-coils on said respective pole pieces being in registry, with each sub-coil on one pole piece being connected in series with the sub-coil in registry therewith on the other pole piece for unidirectional current flow in the respective sub-coils connected in series and forming a sub-coil pair which generates a pair of output signals, and means for electronically operational sign weighting of each of said pair output signals.

14. A magnetic resonance imaging apparatus as claimed in claim 13 wherein said means for electronically operational sign weighting of said pair output signals comprises:

for each pair output signal, first and second low-pass filters and first and second pre-amplifiers respectively connected to the sub-coils in said pair; and first, second and third operational amplifiers for respectively supplying first, second and third measured value, operational sign-weighted signals, said first, second and third operational amplifiers having inputs respectively connected to the outputs of the pre-amplifiers for each sub-coil, said first operational amplifier having all outputs of said pre-amplifiers connected thereto wit a same operation sign, said second operational amplifier having the outputs of all pre-amplifiers for all sub-coils in a first of said sensor coils connected thereto with a first operational sign and all outputs of all pre-amplifiers for the sub-coils of a second of said sensor coils connected thereto with a second operational sign, and said third operational amplifier having all outputs of all pre-amplifiers for the sub-coils of said first sensor coil thereto with said second operational sign and all outputs of all pre-amplifiers of said sub-coils of said second sensor coil being connected thereto with said first operational sign.

15. A magnetic resonance imaging apparatus as claimed in claim 13 wherein said means for electronically operational sign weighting of said pair output signals comprises, for each pair, first and second low-pass filters and first and second pre-amplifiers respectively connected to the sub-coils in each pair, and an operational amplifier for generating a dynamic main magnetic field boost signal, said operational amplifier having a first input to which all of the outputs of the pre-amplifiers for all of the sub-coils on one of said pole pieces are connected with a first operational sign, and a second input to which all of the outputs of all of the pre-amplifiers of the sub-coils on the other of said pole pieces are connected with a second operational sign.

* * * * *